United States Patent
Franceschini et al.

(10) Patent No.: US 8,769,374 B2
(45) Date of Patent: Jul. 1, 2014

(54) MULTI-WRITE ENDURANCE AND ERROR CONTROL CODING OF NON-VOLATILE MEMORIES

(75) Inventors: Michele M. Franceschini, White Plains, NY (US); Ashish Jagmohan, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 12/903,695

(22) Filed: Oct. 13, 2010

(65) Prior Publication Data

US 2012/0096328 A1 Apr. 19, 2012

(51) Int. Cl.
*G11C 29/00* (2006.01)

(52) U.S. Cl.
USPC .......................... 714/763; 714/773

(58) Field of Classification Search
USPC .................................. 714/763, 773
See application file for complete search history.

(56) References Cited

U.S. PATENT DOCUMENTS

| | | | |
|---|---|---|---|
| 4,691,299 A | 9/1987 | Rivest et al. | |
| 6,138,203 A | 10/2000 | Inokuchi et al. | |
| 6,157,570 A | 12/2000 | Nachumovsky | |
| 6,449,116 B2 | 9/2002 | Morris et al. | |
| 6,532,121 B1 | 3/2003 | Rust et al. | |
| 6,640,319 B1 | 10/2003 | Weng | |
| 6,701,408 B2 * | 3/2004 | Egner et al. | 711/101 |
| 6,725,321 B1 | 4/2004 | Sinclair et al. | |
| 6,788,612 B2 | 9/2004 | Hsu et al. | |
| 6,794,997 B2 | 9/2004 | Sprouse | |
| 6,903,981 B2 | 6/2005 | Futatsuyama et al. | |
| 6,961,890 B2 | 11/2005 | Smith | |
| 6,978,342 B1 | 12/2005 | Estakhri et al. | |
| 6,996,660 B1 | 2/2006 | Moore et al. | |
| 7,039,788 B1 | 5/2006 | Change et al. | |
| 7,062,602 B1 | 6/2006 | Moore et al. | |
| 7,080,192 B1 | 7/2006 | Wong | |
| 7,177,974 B2 | 2/2007 | Egner et al. | |
| 7,245,556 B1 | 7/2007 | Pinto et al. | |
| 7,315,870 B2 | 1/2008 | Mukaida | |
| 7,340,581 B2 | 3/2008 | Gorobets et al. | |
| 7,382,660 B2 | 6/2008 | Bovino et al. | |
| 7,398,348 B2 | 7/2008 | Moore et al. | |

(Continued)

OTHER PUBLICATIONS

A. Ben-Aroya; "Competitive Analysis of Flash-Memory Algorithms"; Lecture Notes in Computer Science 4168 (2006) pp. 1-59.

(Continued)

*Primary Examiner* — Philip Guyton
(74) *Attorney, Agent, or Firm* — Cantor Colburn LLP

(57) ABSTRACT

Multi-write endurance and error control coding of non-volatile memories including a method for receiving write data and a write address of a memory page in a memory. The write data is partitioned into a plurality of sub-blocks, each sub-block including q bits of the write data. Error correction bits are generated at the computer in response to the sub-blocks and to an error correction code (ECC). At least one additional sub-block containing the error correction bits are appended to the partitioned write data and a write word is generated. The write word is generated by performing for each of the sub-blocks: selecting a codeword such that the codeword encodes the sub-block and is consistent with current electrical charge levels of the plurality of memory cells associated with the memory page; concatenating the selected codewords to form the write word; and writing the write word to the memory page.

25 Claims, 9 Drawing Sheets

(56) References Cited

U.S. PATENT DOCUMENTS

| | | | |
|---|---|---|---|
| 7,409,489 | B2 | 8/2008 | Sinclair |
| 7,409,521 | B2 | 8/2008 | Umeda |
| 7,409,524 | B2 | 8/2008 | Safford et al. |
| 7,441,090 | B2 | 10/2008 | Estakhri et al. |
| 7,450,420 | B2 | 11/2008 | Sinclair et al. |
| 7,457,909 | B2 | 11/2008 | Di Sena et al. |
| 7,493,442 | B2 | 2/2009 | Wong et al. |
| 7,509,524 | B2 | 3/2009 | Patel et al. |
| 7,511,646 | B2 | 3/2009 | Cornwell |
| 7,516,371 | B2 | 4/2009 | Sakaue et al. |
| 7,529,881 | B2 | 5/2009 | Pascucci et al. |
| 7,539,077 | B2 | 5/2009 | Yoon et al. |
| 7,601,408 | B2 | 10/2009 | Young et al. |
| 7,697,325 | B2 | 4/2010 | Sprouse et al. |
| 7,809,994 | B2 * | 10/2010 | Gorobets ............... 714/52 |
| 7,877,564 | B2 | 1/2011 | Eldredge et al. |
| 8,050,086 | B2 | 11/2011 | Shalvi et al. |
| 8,140,939 | B2 * | 3/2012 | Colmer et al. ........... 714/764 |
| 8,176,234 | B2 | 5/2012 | Franceschini et al. |
| 2003/0037215 | A1 | 2/2003 | Chen |
| 2004/0160343 | A1 | 8/2004 | Sprouse |
| 2006/0282610 | A1 | 12/2006 | Dariel et al. |
| 2007/0033375 | A1 | 2/2007 | Sinclair et al. |
| 2007/0147168 | A1 | 6/2007 | Pinto et al. |
| 2007/0150644 | A1 | 6/2007 | Pinto et al. |
| 2007/0168632 | A1 | 7/2007 | Zeevi et al. |
| 2007/0171714 | A1 | 7/2007 | Wu et al. |
| 2007/0233939 | A1 | 10/2007 | Kim |
| 2007/0233941 | A1 | 10/2007 | Lee et al. |
| 2008/0256352 | A1 | 10/2008 | Chow et al. |
| 2009/0027652 | A1 | 1/2009 | Chang et al. |
| 2009/0055605 | A1 | 2/2009 | Wu et al. |
| 2009/0080249 | A1 | 3/2009 | Sprouse et al. |
| 2009/0125671 | A1 | 5/2009 | Flynn et al. |
| 2009/0150595 | A1 | 6/2009 | Lavan |
| 2009/0150600 | A1 | 6/2009 | Suda |
| 2009/0327590 | A1 | 12/2009 | Moshayedi |
| 2009/0327591 | A1 | 12/2009 | Moshayedi |
| 2010/0088464 | A1 | 4/2010 | Yang |
| 2010/0158043 | A1 | 6/2010 | Bodo et al. |
| 2010/0281340 | A1 | 11/2010 | Franceschini |
| 2010/0281341 | A1 | 11/2010 | Franceschini |
| 2010/0281341 | A1 * | 11/2010 | Wu et al. ............ 714/763 |
| 2010/0332729 | A1 | 12/2010 | Alrod et al. |
| 2011/0138104 | A1 | 6/2011 | Franceschini |
| 2011/0138105 | A1 | 6/2011 | Franceschini |
| 2011/0238903 | A1 * | 9/2011 | Ban ................... 711/103 |
| 2011/0258370 | A1 * | 10/2011 | Sharon et al. ........... 711/103 |
| 2012/0023384 | A1 * | 1/2012 | Naradasi et al. ......... 714/763 |
| 2012/0096328 | A1 | 4/2012 | Franceschini et al. |

OTHER PUBLICATIONS

A. Ben-Aroya et al.; "Competitive Analysis of Flash-Memory Algorithms"; ESA 2006; LNCS4168; pp. 100-111.

A. Fiat et al; Generalized "Write-Once" Memories; IEEE Transactions on Information Theory; vol. IT-30, No. 3, May 1984; pp. 470-480.

Ashish Jagmohan et al.; "Write Amplification Reduction in NAND Flash through Multi-Write Coding"; storageconference.org/2010/Presentations/Research/S10.Jagmohan.pdf; Jun. 2010.

A. Jiang; On the Generalization of Error-Correcting WOM Codes; in IEEE International Symposium on Information Theory; ISIT 2007, pp. 1391-1395.

A. Jiang et al.; "Floating Codes for Joint Information Storage in Write Asymmetric Memories"; in IEEE International Symposium on Information Theory, ISIT 2007; pp. 1166-1170.

A. Kawaguchi et al.; "A Flash memory Based File System"; pp. 1-10.

C. Heegard; "On the Capacity of Permanent Memory"; IEEE Transactions on Information Theory; vol. IT-31; No. 1; Jan. 1985; pp. 34-42.

C. Heegard et al.; "On the Capacity of Computer Memory with Defects"; IEEE Transactions on Informaiton Theory, vol. IT-29, No. 5, Sep. 1983; pp. 731-739.

D. Dolev et al. "Correcting Faults in Write Once Memory"; 1984 ACM 0-89791-133-4/84/004/0225; pp. 225-229.

D. Woodhouse; "JFFS: The Journaling Flash File System"; in Ottawa Linux Symposium; pp. 1-12.

E. Yaakobi et al.; "Error Correction Coding for Flash Memories"; Flash Memory Summit, Aug. 2009; pp. 1-17.

E. Yaakobi et al.; "Multidimensional Flash Codes"; arXiv.0901.0702v3 [cs.IT]; Apr. 3, 2009; pp. 1-8.

Eran Gal et al.; "Algorithms and Data Structures for Flash Memories"; ACM Computing Surveys 37, No. 2, (2005); pp. 138-163.

F. Merkx; 09-Womcodes Constructed With Projective Geometries; Traitement du Signal; vol. 1, No. 2-2 (1984); pp. 227-231.

"Design of on-chip error correction systems for multilevel NOR and NAND flash memories"; F. Sun et al.; IET Circuit Devices Syst., 2007, 1, (3); pp. 241-249.

Fang-Wei Fu et al.; "On the Capacity and Error-Correcting Codes of Write-Efficient Memories"; IEEE Transactions on Information Theory; vol. 46; No. 7; Nov. 2000; pp. 2299-2314.

U.S. Appl. No. 12/433,669, filed Apr. 30, 2009; "Adaptive Endurance Coding of Non-Volatile Memories".

U.S. Appl. No. 12/631,470, filed Dec. 4, 2009 "Method and System for Multi-wire Coding for NAND Flash Device".

U.S. Appl. No. 12/631,505, filed Dec. 4, 2009; "NAND Flash System with Enhanced Write Performance and Endurance".

Fang-Wei Fun et al.; "On the Capacity of Generalized Write-Once Memory with State Transitions Described by an Arbitrary Directed Acyclic Graph"; IEEE Transactions of Information Theory; vol. 45; No. 1; Jan. 1999; pp. 308-313.

Huang, W.T. et al., "A compression layer for NAND type flash memory systems," Information Technology and Applications, 2005. ICITA 2005, Third International Conference on, vol. 1, No. 599-604 vol. 1, Jul. 4-7, 2005.

Huang, W.T. et al. "The Real-Time Compression Layer for Flash Memory in Mobile Multimedia Devices", Multimedia and Ubiquitious Engineering, 2007. MUE '07. International Conference on, vol. No. p. 171-176, Apr. 26-28, 2007.

Lee, Suyoun et al., "A Novel Programming Method to Refresh a Long-Cycled Phase Change Memory Cell", Non-Volatile Semiconductor Memory Workshop, 2008 and 2008 International Conference on Memory Technology and Design. NVSMW/ICMTD 2008. Joint, vol., No., p. 46-48, May 18-22, 2008.

Shih, Xin-Yu et al., "A real-time programmable LDPC decoder chip for arbitrary QC-LDPC parity check matrices," Solid-State Circuits Conference 2009, A-SSCC 2009, IEEE Asian, vol. No. pp. 369-372, Nov. 16-18, 2009.

Kang et al., "Improving the endurance characteristics through boron implant at active edge in 1 G NAND Flash"; IEEE, Apr. 15-19, 2007; pp. 652-653.

Fang-Weig Fu et al.; "On the Capacity of Generalized Write-Once Memory with State Transitions Described by an Arbitrary Directed Acyclic Graph"; IEEE Transactions of Information Theory; vol. 45; No. 1; Jan. 1999; pp. 308-313.

G. Cohen et al.; "Linear Binary Code for Write Once Memories"; IEEE Transactions on Information Theory; vol. IT-32; No. 5; Sep. 1986; pp. 697-700.

Godard et al.; "Evaluation of Design for Reliability Techniques in Embedded Flash Memories"; 2007; IEEE Xplore (978-3-9810801-2-4/DATE07 2007 EDAA); pp. 1-6.

H. Finucane et al.; "Designing Floating Codes for Expected Performance"; in Communication, Control and Computing; 2008, 46th Annual Allerton Conference on 2008; pp. 1389-1396.

Hu et al.; "Write Amplification Analysis in Flash-Based Solid State Drives"; SYSTOR 2009; pp. 1-13.

IBM; Adding and Wear-Leveling (and Potentially Atomic Journaling) Support for Metadata on FAT12/FAT16/FAT32 File System; IP.com No. IPCOM000175280D; Publication Date: Oct. 7, 2008; pp. 1-3.

Ivaniuk et al.; Detecting Multiple Errors in RAM by Self-Adjusting Output Data Compression, ISSN 1063-7397, Russian Microelectronics 2007; vol. 36, No. 4, pp. 271-277.

(56) References Cited

OTHER PUBLICATIONS

J. Fridich et al.; "Steganography via Codes for Memory with Defective Cells"; in 43rd Conference on Coding; Communication and Control 2005; pp. 1-17.

J. Martin Borden et al.; On-Coding for "Stuck-At" Defects; IEEE Transactions on Information Theory; vol. IT-33; No. 5; Sep. 1987; pp. 729-735.

Jai Menon et al.; "An Age Threshold Algorithm for Garbage Collection in Log-Structured Arrays and File Systems," (Citeseer, 1998); pp. 1-15.

Li-Pin Chang et al.; Real-Time Garbage Collection for Flash-Memory Storage Systems of Real-Time Embedded Systems; ACM Transactions on Embedded Computing Systems; vol. 3, No. 4, Nov. 2004; pp. 837-863.

M. Mitzenmacher et al.; "The Power of Two Random Choices: A Survey of Techniques and Results"; pp. 1-60.

Mandavifar et al; "A Nearly Optimal Construction of Flash Codes"; arXiv:0905.1512v1 [cs.IT]; May 10, 2009; pp. 1-5.

R. Krishnamoorthy et al.; "Error Control to Increase the Yield of Semiconductor RAM's"; in Information Theory Workshop at Cornell; the 1989 IEEE/CAM, 1989, 7-3; 1 page.

R. Rivest et al.; How to Reuse a "Write-Once" Memory; Reprinted from Information; vol. 55, Nos. 1-3, Oct./Nov./Dec. 1982 Printed in Belgium; pp. 1-19.

Yetis, C.M. et al., "Location dependent and rotated group space-time block codes," Signal Processing and Communications Applications Conference, Apr. 2004, Proceedings of the IEEE 12th, vol. No., pp. 526-529.

\* cited by examiner

MULTI-WRITE ENDURANCE AND ERROR CONTROL CODING OF NON-VOLATILE MEMORIES

BACKGROUND

The present invention relates generally to computer memory, and more specifically to multi-write endurance and error control coding of non-volatile memories.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and can no longer reliably store information One characteristic of contemporary NAND flash memory devices is that they do not support page erase. The absence of page erases, implies that once a page is written, it cannot be rewritten until the entire block (e.g., made up of sixty-four pages) is erased. If a logical address corresponding to a page needs to be refreshed, this is accomplished by marking the page as invalid and mapping the logical block address to a different physical page. Periodic garbage collection is required to be performed, where blocks with only a few valid pages are freed up by copying their valid pages to other physical pages, after which the block can be erased. This increases the number of writes required in a flash memory device, an effect that is often referred to as "write amplification". Write amplification adversely affects the lifetime of the flash device due to the wear caused by the additional program/erase cycles.

SUMMARY

An embodiment is a method for storing data in memory. The method includes receiving write data that includes a plurality of bits and receiving a write address of a memory page in a memory. The memory page is associated with a plurality of memory cells having current electrical charge levels. At a computer, the write data is partitioned into a plurality of sub-blocks, each sub-block including q bits of the write data. Error correction bits are generated at the computer in response to the sub-blocks and to an error correction code (ECC). At least one additional sub-block containing the error correction bits are appended to the partitioned write data and a write word is generated. The write word is generated by performing for each of the sub-blocks: selecting a codeword such that the codeword encodes the sub-block and is consistent with the current electrical charge levels of the plurality of memory cells associated with the memory page; concatenating the selected codewords to form the write word; and writing the write word to the memory page.

Another embodiment is a system that includes a receiver for receiving write data and a write address of a memory page in a memory. The memory page is associated with a plurality of memory cells having current electrical charge levels. The system also includes an encoder communicatively coupled to the memory. The encoder performs a method that includes: partitioning the write data into a plurality of sub-blocks, each sub-block comprising q bits of the write data; generating error correction bits in response to the sub-blocks and to an ECC; appending at least one additional sub-block containing the error correction bits to the partitioned write data; and generating a write word. The generating a write word includes performing, for each of the sub-blocks: selecting a codeword such that the codeword encodes the sub-block and is consistent with the current electrical charge levels of the plurality of memory cells associated with the memory page; concatenating the selected codewords to form the write word; and writing the write word to the memory page A further embodiment is a computer implemented method for retrieving data from memory. The method includes receiving a read address of a memory page in a memory and retrieving a read word from the memory page. The read word includes a plurality of codewords including at least one codeword that corresponds to error correction bits. It is determined, at a computer, that each of the codewords is in a set of codewords used to generate the read word. The method further includes generating read data. Generating the read data includes performing, for each of the codewords: selecting a sub-block that includes data that corresponds to the codeword. The sub-blocks are concatenated and ECC processing is performed on the read data in response to the error correction bits and to the sub-blocks. The error correction bits are removed from the read data and the read data is output.

A further embodiment is a system for retrieving data including a receiver for receiving a read address of a memory page in a memory and a decoder communicatively coupled to the memory. The coder is for performing a method that includes retrieving a read word from the memory page. The read word includes a plurality of codewords including at least one codeword that corresponds to error correction bits. It is determined that each of the codewords is in a set of codewords used to generate the read word. The method further includes generating read data. Generating the read data includes performing, for each of the codewords: selecting a sub-block that includes data that corresponds to the codeword. The sub-blocks are concatenated and ECC processing is performed on the read data in response to the error correction bits and to the sub-blocks. The error correction bits are removed from the read data and the read data is output.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
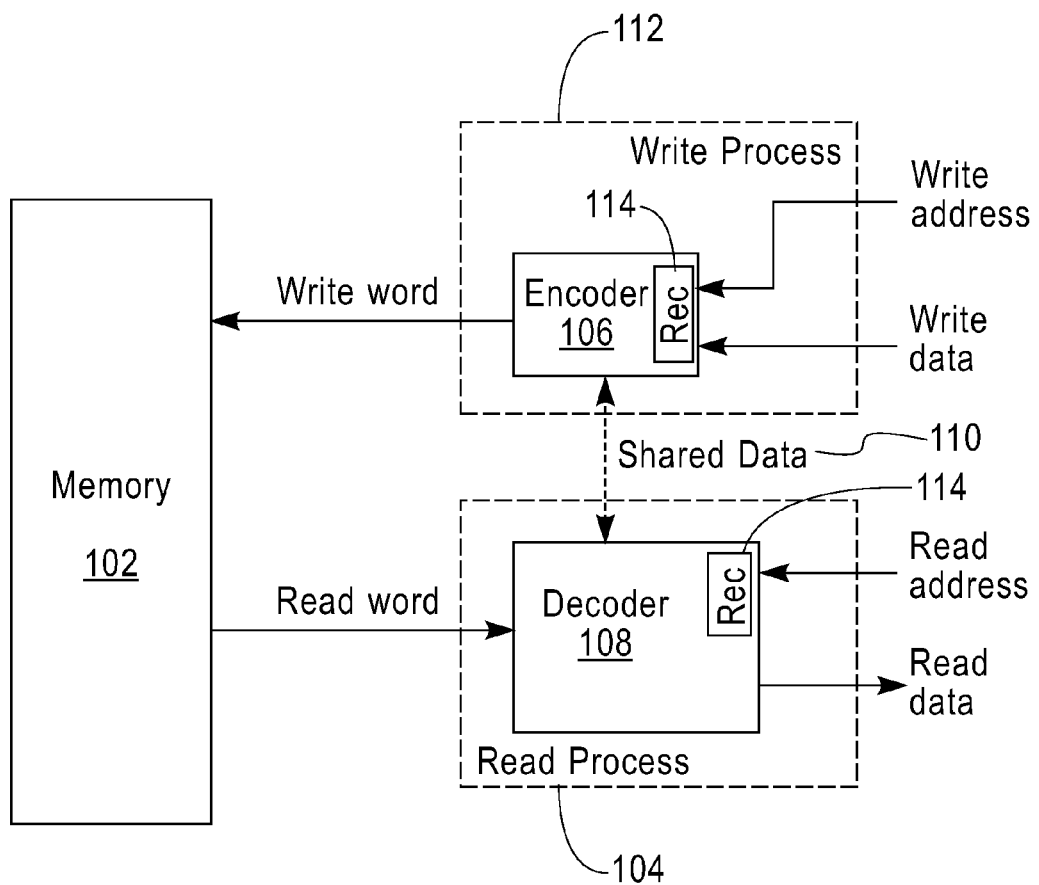
FIG. 1 illustrates a block diagram of a system for storing and retrieving data in a memory system in accordance with an embodiment.

An embodiment of the present invention provides error detection and correction that is integrated into multi-write endurance (MWE) codes that are applied to write data to allow a page in a non-volatile memory (e.g., a flash memory) to be written multiple times before it requires erasure. An embodiment described herein performs joint error-control and MWE coding in a manner that preserves the reliability afforded by an error correction code (ECC) and that is flexible with respect to various parameters such as coding-rate, bit-error rate (BER), etc. An embodiment includes an ECC encoder that is concatenated with a MWE encoder to provide ECC protection and that ensures consistency with a current page state. In an embodiment, the ECC encoding is performed first with an appropriate alphabet size, followed by a symbol-by-symbol expansion of the ECC codeword by using an appropriate MWE code. Each error in the resulting write word (i.e., the data written to memory) is then restricted to at most one individual symbol in the ECC codeword. Thus, reliability (in the form of parity symbols) is provided very efficiently, while allowing multiple writes and/or endurance coding.

To combat the low endurance of NAND flash memory, techniques of adaptive endurance coding and multi-write coding have been described, for example, in U.S. patent application Ser. No. 12/631,470 filed on Dec. 4, 2009, patent application Ser. No. 12/433,669 filed on Apr. 30, 2009, and patent application Ser. No. 12/631,505 filed on Dec. 4, 2009 all of which are incorporated by reference herein in their entirety. Endurance coding relies on the insight that by using an appropriate code that shapes the frequency of the written levels in a flash memory page, the wear induced on the page can be significantly reduced. Adaptive endurance coding combines lossless data compression with endurance coding, in a manner which adapts the endurance coding parameters to the properties of the data and to memory parameters such as memory page size. Thus, if the data to be written is very compressible, a high endurance gain can be achieved. Alternately, if the data is not very compressible, the endurance code is selected so as to ensure that the coded data will fit into the memory page. Multi-write coding further uses constrained codes to yield a system where each page can be written to more than once. This allows a page to be in a previously written state or in an erased state prior to performing a write to the page. By appropriately selecting the pages to write or rewrite to, and by appropriately selecting blocks to free through garbage collection, the write amplification of the system can be significantly reduced, which leads to improved device performance (in terms of total write latency) and increased endurance of the system.

An important consideration is the design/selection of error correction codes (ECCs) that can be used to enhance the reliability of MWE coded data. Enhancing the reliability of MWE coded data is important given that flash devices generally have a non-zero BER. A central issue in such a design/selection is that the parity bits (also referred to here in as "ECC bits" or "error correction bits") generated by an ECC need to be compatible with MWE coding. For example, in MWE coding the codeword (i.e., the write word) to be written into a page has to be writable without requiring an erase given the previous contents of the page. An embodiment utilizes an SLC memory where a value of "1" is stored in a memory cell after a refresh or erase, and a value of "0" is stored after the cell has been programmed. In this embodiment, if the previous contents of the page include cells with the values "111000", then writing a value of "011000" is consistent with previous contents of the page. In contrast, writing a value of "111001" is not consistent with previous contents of the page because it would require a page erase to get the value of the last bit back to a "1" before writing. This is referred to herein as having a codeword that is consistent with the previous contents of the page. Both, the codeword and the ECC bits (e.g., parity bits) should be consistent with the previous contents on the corresponding cell locations in the memory page. It is not advantageous to simply convert an ECC codeword into a consistent MWE write word, since such a process may significantly reduce the protection afforded by the ECC due to error propagation.

An embodiment of the present invention provides for error detection and correction to be integrated into MWE codes that are used to allow a page in a non-volatile memory, such as a not-and (NAND) flash memory device, to be written multiple times before it needs to be erased. In one embodiment, the MWE codes are designed to maximize the endurance of NAND flash memory devices by minimizing the number of cells required to be programmed in each write, while the ECCs are designed to ensure data reliability, and the ECC and MWE encoded codeword is guaranteed to be consistent with the previous contents of the cell. This may significantly reduce write amplification (and the associated loss of endurance and write latency) and increase the lifetime of the cells in each page while allowing for error correction and detection of data stored in the NAND flash memory.

Because of the potential volatility and degradation of NAND flash memory, optimizing writes to memory may greatly increase the useable life of the memory. One method of optimizing write operations is to encode data before storing it, using, for example, a MWE algorithm. When data is written to memory a second time, optimized algorithms are used to match patterns in memory with the data that is being rewritten, thereby reducing the number of erase operations and extending the life of the memory. Introducing an ECC however, complicates the optimization algorithms by adding ECC bits to the data being stored.

One method of incorporating ECC into data write operations is to generate an ECC based on a MWE encoded value of the data to be stored. This method, however, introduces random ECC bits to the data that have not been optimized and therefore reduces or eliminates the effectiveness of the MWE. For example, when using a systematic ECC code, the check bits (also termed parity bits) to be appended to the data may not be consistent with the previous contents of the page (i.e. it may not be possible to write them to the page without performing a page erase operation). Another method is to perform ECC encoding on the data before MWE is performed and then encoding the data and ECC bits as a block using MWE. Although this method allows optimized writing of data to memory, it does not allow for the effective correction of errors introduced after the data has been written to memory because the ECC code cannot be used until the MWE encoded data is decoded. Therefore, any errors introduced to the stored data after the MWE would propagate to all of the data that has been decoded. Embodiments of the present invention integrate ECC and MWE encoding to allow for both optimized use of memory, and robust error correction.

FIG. 1 illustrates a block diagram of a system for storing and retrieving data in a memory in accordance with an embodiment. The system depicted in FIG. 1 includes a memory 102 having blocks of memory cells (each block made up of pages), an encoder 106 for receiving write data and generating an ECC encoded write word for storage in the memory cells, a decoder 108 for receiving a read word from the memory and generating read data, and shared data 110 storing characteristics of the stored data for use by both the encoder 106 and the decoder 108. In an exemplary embodiment, the encoder 106 the shared data 110 are used by a write process 112, and the decoder 108 and shared data 110 are utilized by a read process 104.

In one embodiment the encoder 106, decoder 108, and shared data 110 are located on a memory controller or memory module. In an alternate embodiment, the encoder 106, decoder 108, and shared data 110 are located on a memory device. The shared data 110 may be stored in a register or any other storage location that is accessible by both the encoder 106 and the decoder 108.

In one embodiment, the memory 102 is implemented by NAND flash memory devices or other non-volatile memory devices such as, but not limited to phase change memory (PCM) devices. In one embodiment, the memory 102 is implemented by a single level cell NAND flash memory device. In another embodiment, the memory 102 is implemented by a multi-level cell NAND flash memory device.

In one embodiment, the ECC is a Reed-Solomon code or other ECC code that uses techniques such as, but not limited to: repetition codes, parity bits, check sums, and cryptographic hashes.

Inputs to the encoder 106 depicted in FIG. 1 include the address of the page to be written (also referred to herein as a "write address"), and the data to be written to the page (also referred to herein as "write data"). As shown in FIG. 1, the inputs are received via a receiver 114 located on the encoder 106. In an exemplary embodiment, the inputs are received via a receiver (e.g., located on a memory device, memory module, memory controller, or other location). The receiver may be implemented in a variety of manners including hardware for receiving the inputs and/or a storage location (e.g., a register) where the inputs are located.

An input to the decoder 108 depicted in FIG. 1 includes the address of the memory location (e.g., a page) to be read. In an exemplary embodiment, the input is received via a receiver 114 (e.g., located on a memory device, memory module, memory controller, or other location). The receiver may be implemented in a variety of manners including hardware for receiving the inputs and/or a storage location (e.g., a register) where the inputs are located.

An output from the decoder 108 depicted in FIG. 1 includes the read data. In an exemplary embodiment, the outputting is by a transmitter (e.g., located on a memory device, memory module, memory controller, or other location). The transmitter (not shown) may be implemented in a variety of manners including hardware for transmitting the output and a storage location or register where the outputs are stored. The encoder 106 and decoder 108 are examples of computers that may be utilized to perform the processing described herein.

Figure 2:
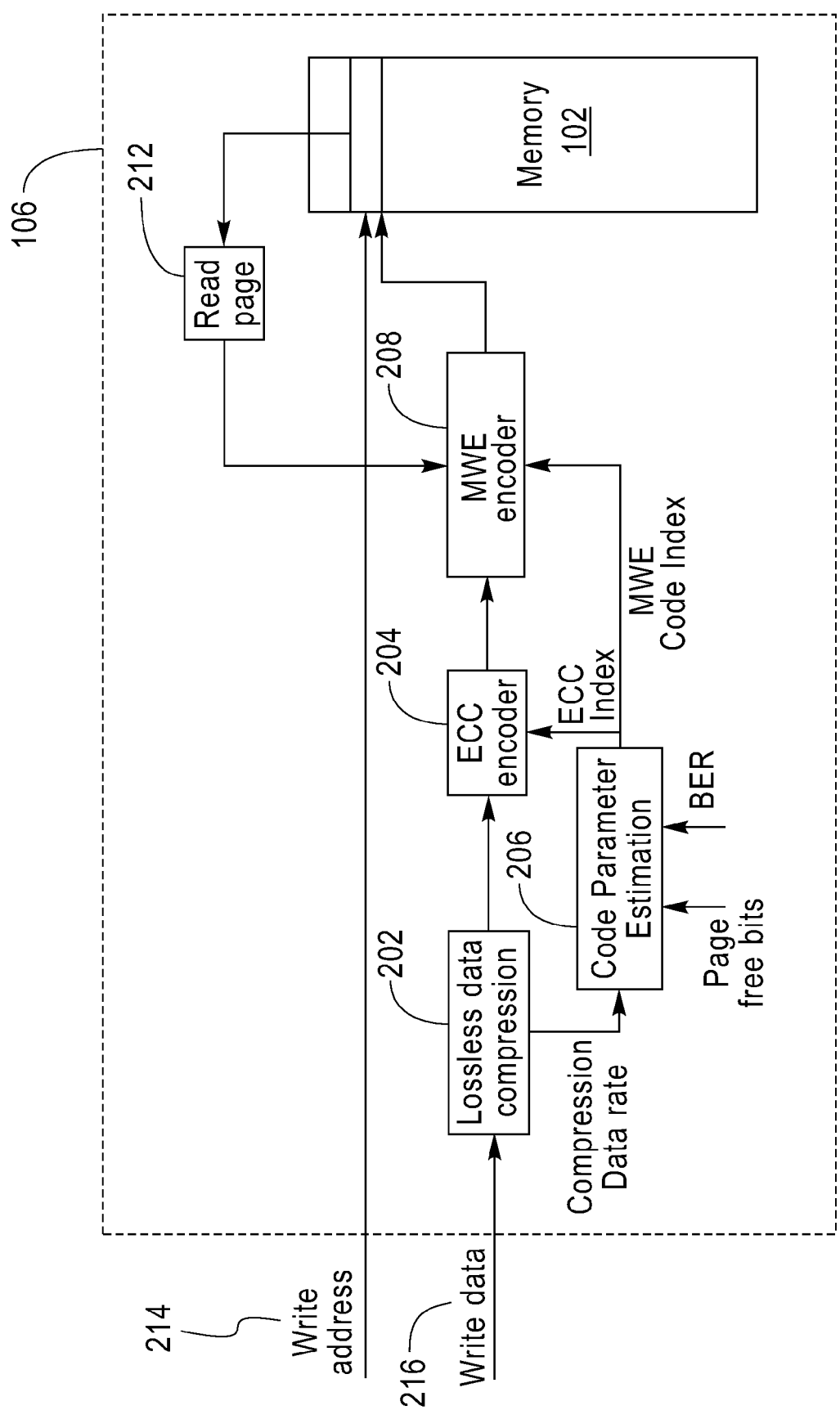
FIG. 2 illustrates a block diagram of a encoder for encoding data in accordance with an embodiment.

FIG. 2 illustrates a block diagram of an embodiment of the encoder 106 in accordance with an embodiment to perform joint ECC and MWE encoding. As shown in FIG. 2, write data 216 is received at the encoder 106 along with a write address 214. In an embodiment, the write data 216 is first compressed by a lossless data compression module 202, resulting in a compression data rate (e.g., number of bits in the compressed write data). Based on the number of free bits in the write page, the expected (or worst-case) BER, and the compression data rate, an appropriate ECC is selected by the code parameter estimation module 206. The selection of the ECC includes a selection of the symbol size to be used (i.e., the number of bits in a sub-block) and a selection of the code rate (i.e., the number of bits in a codeword). The selected symbol size is indicated in FIG. 2 as the ECC index and the selected code rate is indicated in FIG. 2 as the MWE code index.

The selected ECC, as indicated by the ECC index, is then used by the ECC encoder module 204 to perform an ECC encoding of the compressed data. An ECC codeword is then output from the ECC encoder module 204 and sent to the MWE encoder module 208. Input to the MWE encoder module 208 also includes the MWE code index selected by the code parameter estimation module 206 and a read page state 212 read from the memory (e.g., indicates current electrical charge levels of memory cells in the memory page at the write address). The MWE encoder module 208 performs an encoding on each sub-block (or symbol) of the ECC codeword output from the ECC encoder module 204. Each individual sub-block is expanded by the MWE encoder module 208 in a manner that is consistent with the underlying contents of the read page state 212 (e.g., the current electrical charge levels of memory cells in the memory page), and thus allows writing to the memory page such that the frequency of cell contents being written are appropriately shaped to minimize wear. The MWE encoded contents are concatenated to form a write word that is written into the memory 102. In an embodiment, one or both of the ECC and MWE code indices are stored into the memory 102 as meta-data.

Figure 3:
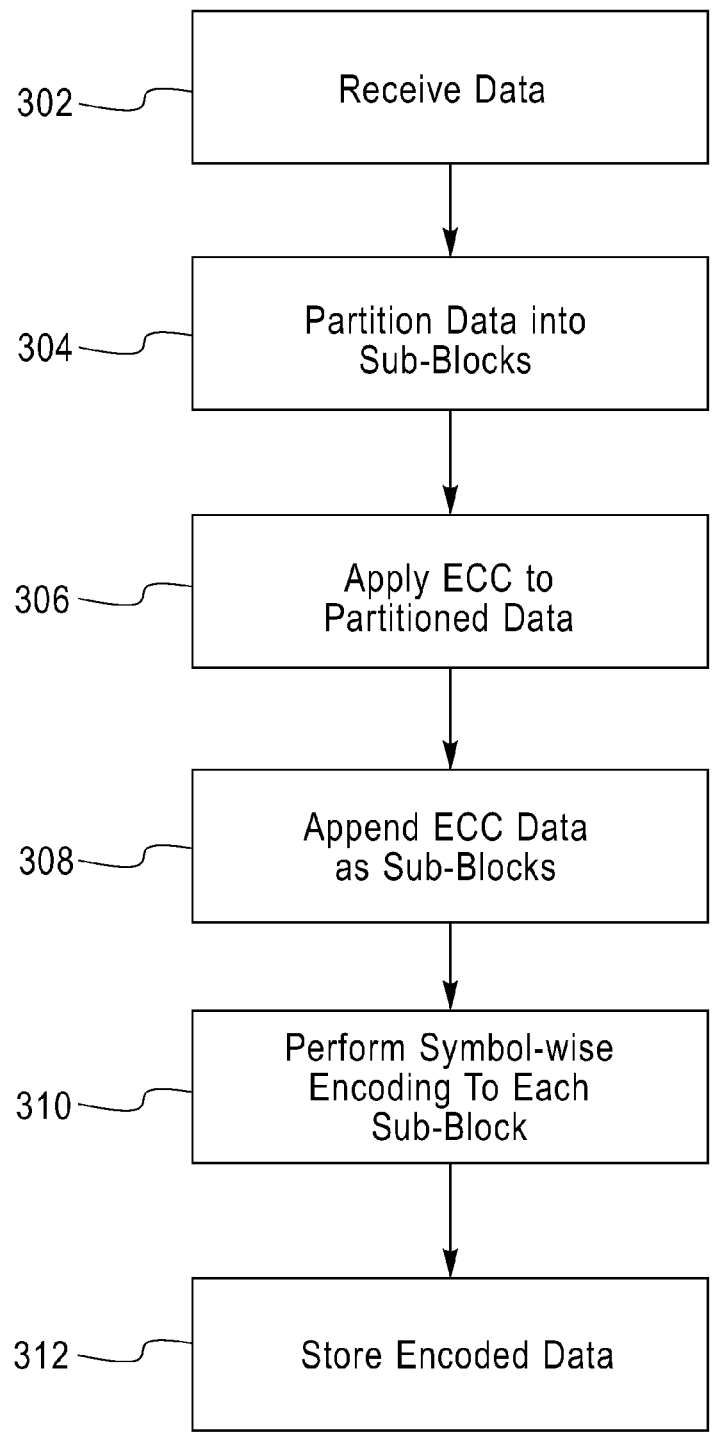
FIG. 3 illustrates a process flow for encoding data in accordance with an embodiment.

FIG. 3 illustrates a process flow executed by an encoder, such as encoder 106 depicted in FIG. 2, in accordance with an embodiment. At block 302, write data 216 to be stored in memory 102 is received by the encoder 106. One of ordinary skill in the art would understand that the write data may be any data larger or smaller than a page of data. At block 304, the encoder 106 partitions the write data 216 into n sub-blocks of q-bits each where q is selected based on: the potential errors to be detected and/or corrected by the ECC (denoted "E"); the bit size of the MWE codewords (denoted "B") in an MWE codeword library described below; the page size (P+2BE, where "P" denotes a base number of cells, and 2BE is the number of additional cells required to store ECC parity/check symbols); and the received data size RP (with $R \le 1$), such that that $q/B \ge R$ and $2^q \ge P/B+2E+1$. In another embodiment the received data size can be larger than or equal to P, and lossless compression is first performed to reduce the size down to RP, where $R \le 1$. Once the data has been partitioned, the partitioned data is passed to an ECC encoder module, such as ECC encoder module 204 in FIG. 2.

At block 306, the ECC encoder module 204 generates ECC bits using an ECC. At block 308, the ECC bits are appended to the data sub-blocks as additional sub-blocks (each additional sub-block having q bits). Once the ECC code is appended to the data, the MWE encoder module 208 performs symbol-wise encoding to each of the sub-blocks including the additional ECC sub-blocks appended to the end of the data sub-blocks at block 310. The size of each of the MWE codewords is B bits. The sub-blocks are encoded based on the current page state, denoted by the sequence $\{p_i\}$ in memory 102 using a set of codewords. The current page state may be refreshed (e.g., all cells having electrical charge levels corresponding to a value of "1" in SLC memory) for an initial write of data into memory 102 (page is in an erased state), or it may be that the page has been previously written for a subsequent write of data into memory 102 (page is in a previously written state). In one embodiment, the parameter B, which effects the complexity of a hardware implementation of the table, or the storage requirements for the table stored in memory, is previously specified. In another embodiment, the ECC parameter q is previously specified, and the size B of the codewords is selected such that that $q/B \geq R$ and $2^q \geq P/B+2E+1$. The codewords are selected such that for each codeword $c_i^{E_1}$ each $c_i^E$ is consistent with $p_i$, $c_i^E \epsilon [0,1]^B$. In an embodiment, the codewords are selected to minimize the number of programmed cells (e.g., cells having electrical charge levels corresponding to a value of 0 in SLC memory) and they are stored in a lookup table in memory 102. The sub-blocks are mapped to the codewords by the MWE module 208 to generate B-bit symbols. At block 312, the codewords are concatenated together to form a write word that is written to the memory 102 at the write address.

In another embodiment, a non-systematic ECC code is used to generate the codeword by changing the entire word and appending additional symbols. Thus, for example, for a data sequence s1 s2 s3, a systematic ECC codeword would look like s1 s2 s3 c1 c2 (where the c's are parity check symbols), while a non-systematic ECC codeword would look like c1 c2 c3 c4 c5 (where the c's represent symbols that contain at least one parity check symbol). When a non-systematic ECC code is used, the symbols are modified or replaced when the codeword is generated.

Figure 4A:
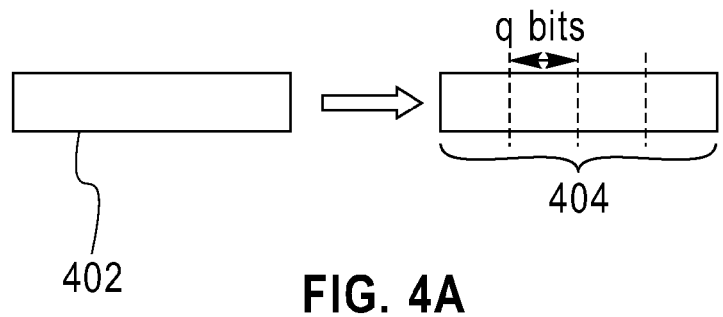
FIGS. 4a-4c illustrate various stages of encoding data in accordance with an embodiment.
Figure 4B:
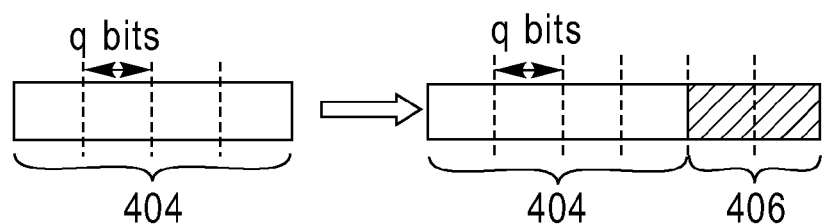
Figure 4C:
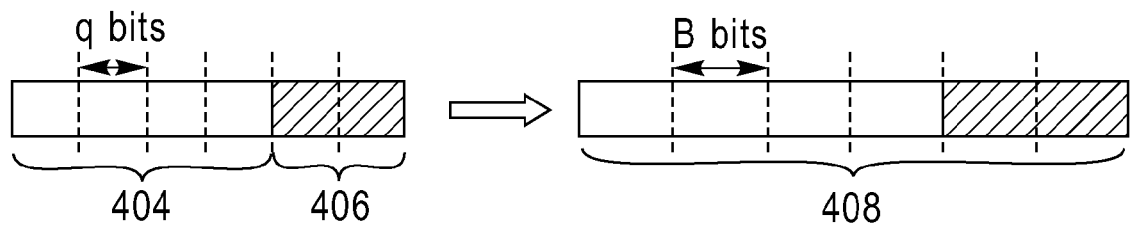

FIG. 4a depicts one embodiment of partitioned data as generated in block 304 of FIG. 3. As shown in FIG. 4a, write data 402 is sent into the ECC encoder module 204 which partitions the data into sub-blocks 404 of q-bits each. It will be understood that the partitioned data may optionally be compressed by the lossless data compression module 202 prior to being partitioned by the ECC encoder module 204. FIG. 4b depicts output from blocks 306 and 308 in FIG. 3 where the ECC bits are generated and then appended as ECC sub-blocks 406 to the partitioned write data. In another embodiment, the ECC code is non-systematic, and the sub-blocks 404 are modified by the ECC encoder as well. FIG. 4c depicts the output of block 310 in FIG. 3 where a write word 408 has been generated by performing symbol-wise MWE encoding to each of the sub-blocks (including the data sub-blocks 404 and the ECC sub-blocks 406).

Figure 5:
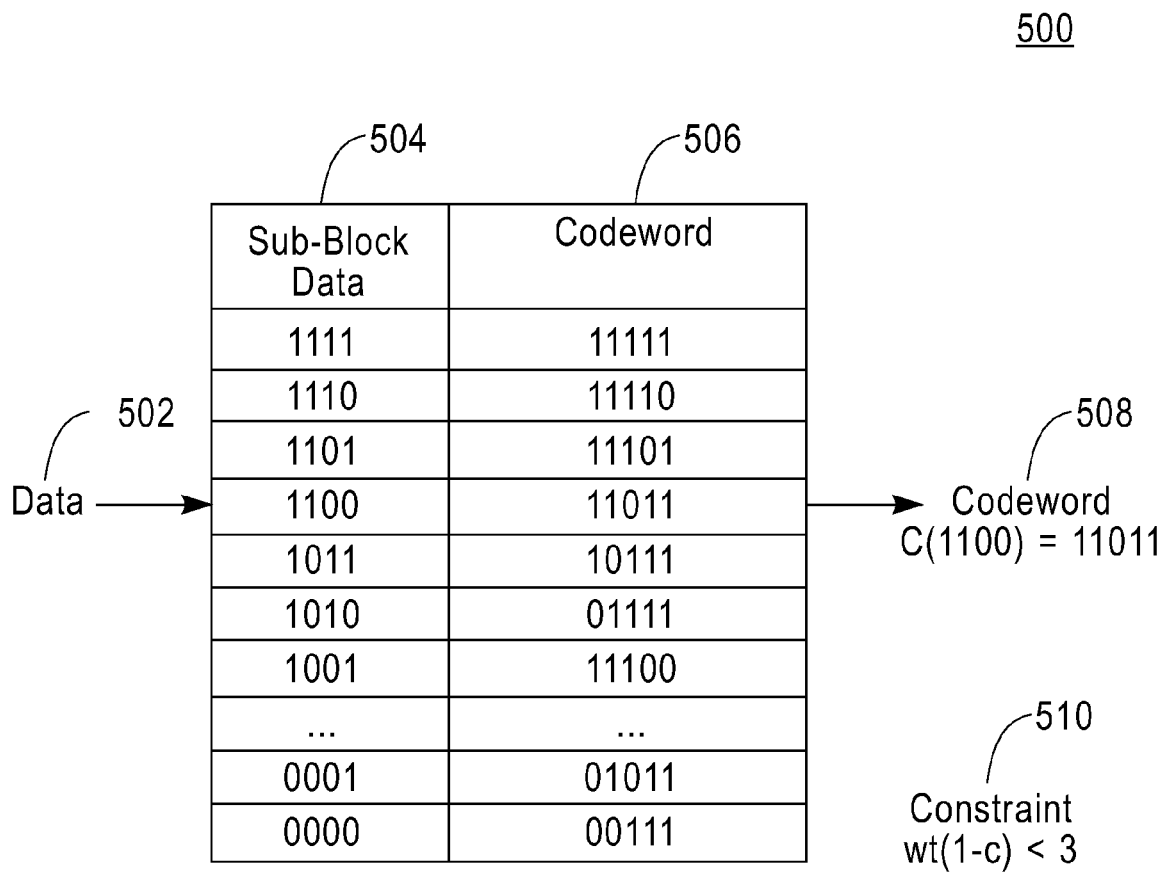
FIG. 5 illustrates a bounded weight binary code in accordance with an embodiment.

FIG. 5 illustrates a bounded weight binary code that may be implemented by one embodiment for mapping q-bit sub-blocks into B-bit codewords as performed by block 310 of FIG. 3. As shown in FIG. 5, a code is represented by a codeword table 500 indexed by the sub-block data. The column 504 corresponding to sub-block data indices does not need to be stored in memory since it can be easily computed from the contents of the q-bit sub-block being encoded. The contents of the codeword table 500 stored in memory are the column 506 of codewords, made up of mutually distinct binary sequences of length B (in this example B is equal to five with each sequence containing at most two zeros). Thus, a constraint 510 satisfied by the code depicted in FIG. 5 is that the number of programmed cells is less than three. The codeword 508 corresponding to data 502 is found by reading off the corresponding codeword entry in the codeword table 500. Thus, for example, the codeword 508 corresponding to data "1100" is the sequence "11011". In an alternative embodiment, the constraint satisfied by the code is that of constant weight, i.e. every codeword has a constant number of a particular level, for example 0s.

Figure 6:
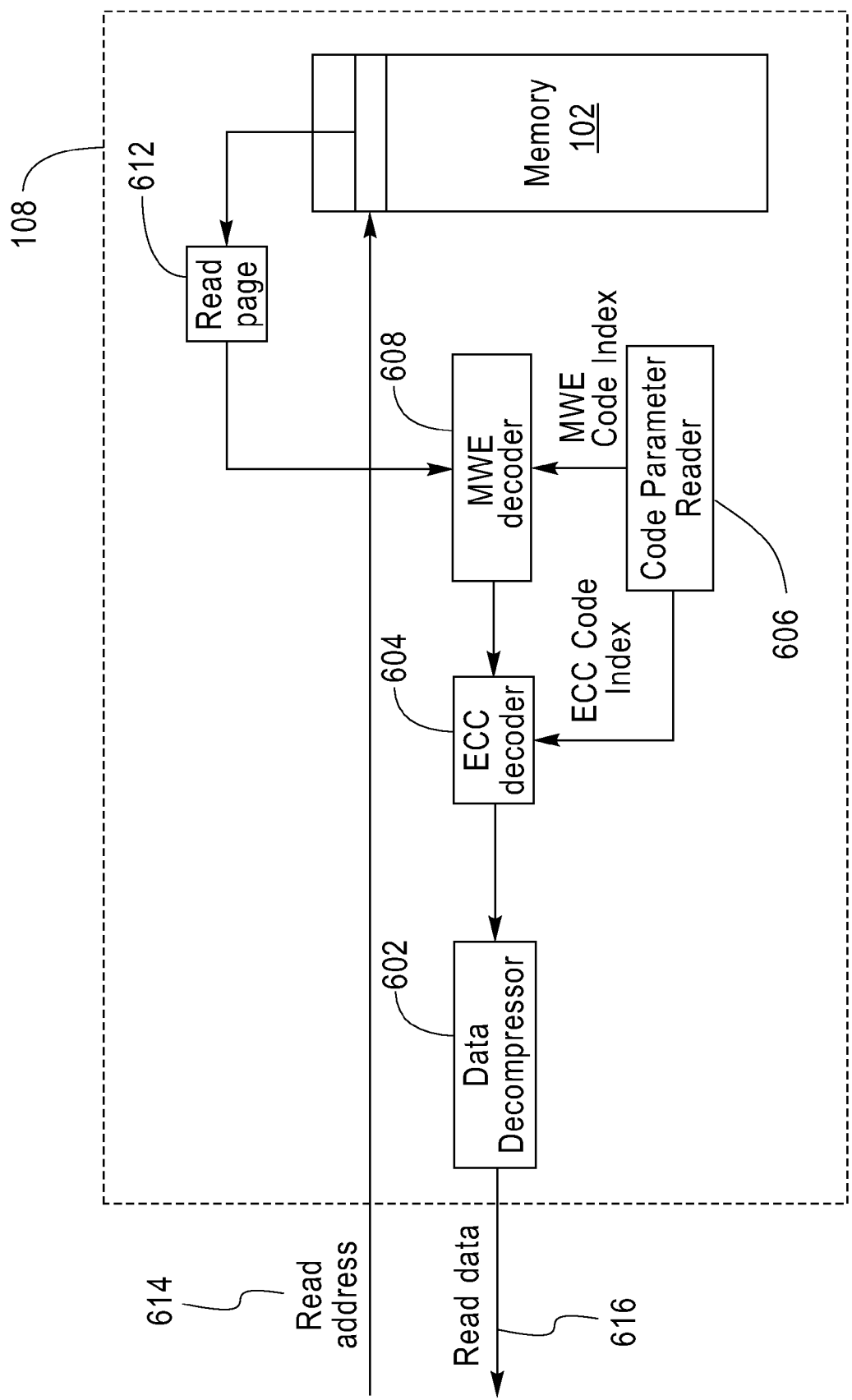
FIG. 6 illustrates a block diagram of a decoder for decoding data in accordance with an embodiment.

FIG. 6 illustrates a block diagram of a decoder 108 in accordance with an embodiment. A read address 614 is passed into the decoder 108, which uses the read address 614 to determine what page to read from the memory 102. The decoder 108 reads the page of data at the read page 612 from the memory 102 at the read address 614. The contents of the read page 612 (e.g., a read word) at the read address 614 are sent to a MWE decoder module 608, which has as an additional input the MWE code used by the encoder 106 (this is shared data 110). The MWE decoder module 608 performs a decoding on each symbol, or codeword, in the read word. This results in a sequence of sub-blocks whose alphabet size is equal to the alphabet size of the ECC code that was applied by the encoder 106. It is possible that, due to errors in the memory 102 certain read symbols, or codewords, do not correspond to a valid codeword. In an embodiment, the sub-blocks corresponding to invalid codewords are marked as erasures. Other sub-blocks may contain errors, and still correspond to valid codewords. The sequence of sub-blocks (and erasures) is then input to the ECC decoder module 604, which as an additional index has the ECC code index used by the encoder 106 (this is shared data 110). The ECC decoder module 604 uses a conventional algebraic decoding algorithm to obtain the corrected compressed data. The corrected data is then decompressed by a data decompressor module 602 to obtain the read data 616.

Figure 7:
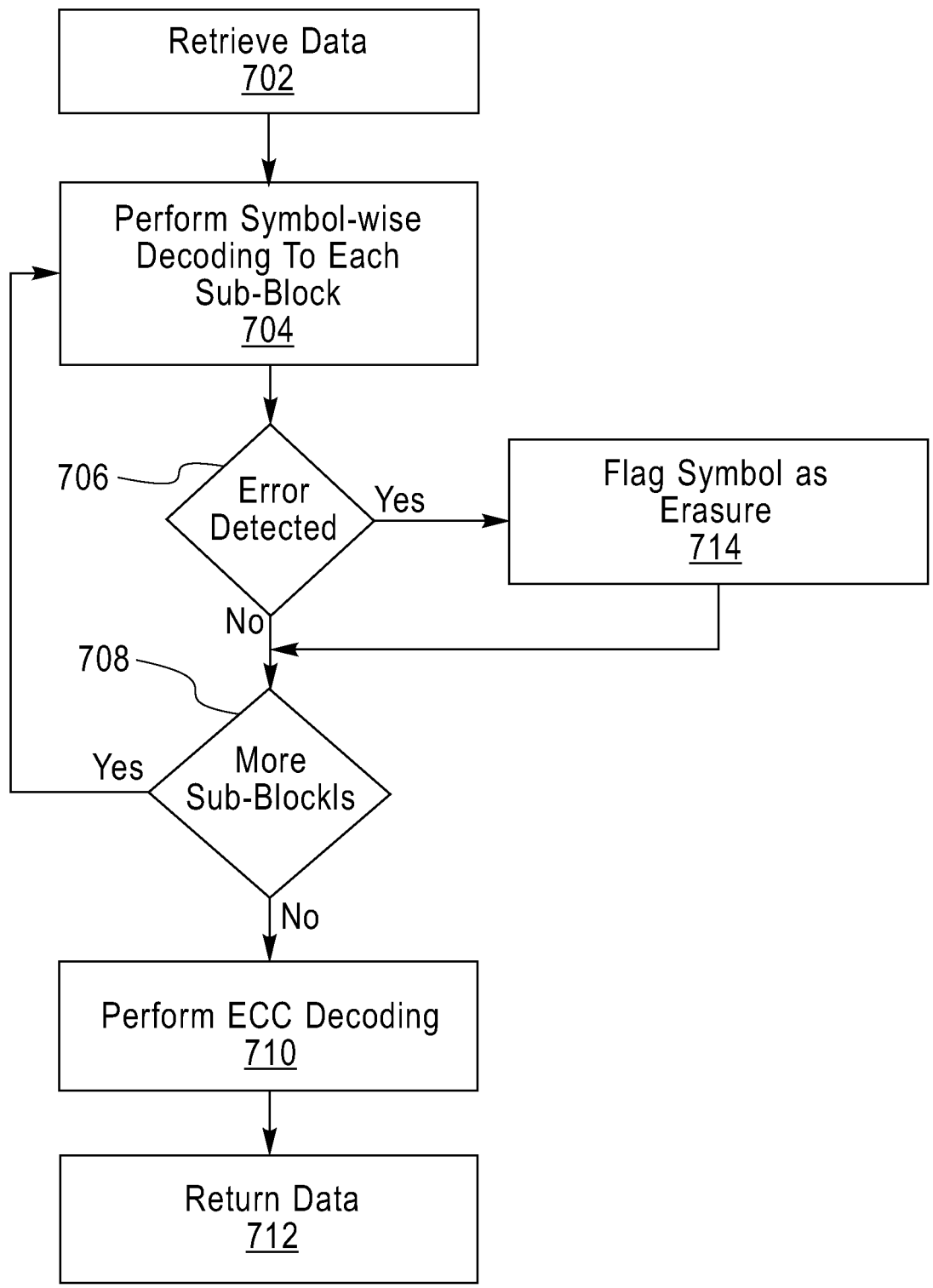
FIG. 7 illustrates a process flow for decoding data in accordance with an embodiment.

FIG. 7 illustrates a process flow executed by a decoder, such as decoder 108, in accordance with an embodiment. At block 702, a read page 612 (e.g., a read word) is retrieved from memory 102. At block 704, symbol-wise decoding is performed by the MWE decoder module 608 on each B-bit symbol, codeword or sub-block, in the read word. At block 706, it is checked for each B-bit symbol sub-block if a corresponding q-bit codeword was found in the MWE codeword lookup table, such as, for example, the codeword table 500 depicted in FIG. 5. If no such codeword was found, the B-bit sub-block is known to be erroneous and block 714 is performed where the MWE decoder module 608, flags the symbol, or codeword, as an erasure. Processing then continues at block 708, where it is determined if there are more sub-blocks to be decoded. If there are more sub-blocks to be decoded, processing continues at block 704. At block 706, if no error is detected, the B-bit sub-block is replaced by the corresponding q-bit codeword from the MWE table, and decoding is continued for all additional sub-blocks of the read word. The resulting sequence of q-bit symbols and erasures is input to the ECC decoder. At block 710, the ECC decoder module 604 corrects any erasures and erroneous symbols in the sequence of q-bit symbols. If the sum of the total number of erasures and errors that the sequence of q-bit symbols contains is less than E, the ECC decoding is guaranteed to succeed. In one embodiment, the ECC decoder module 604 may flag the data as being in an error state when any error or erasure occurred. At block 712, the read of data 616 is returned after removing the encoding (e.g. the ECC bits are removed).

Figure 8A:
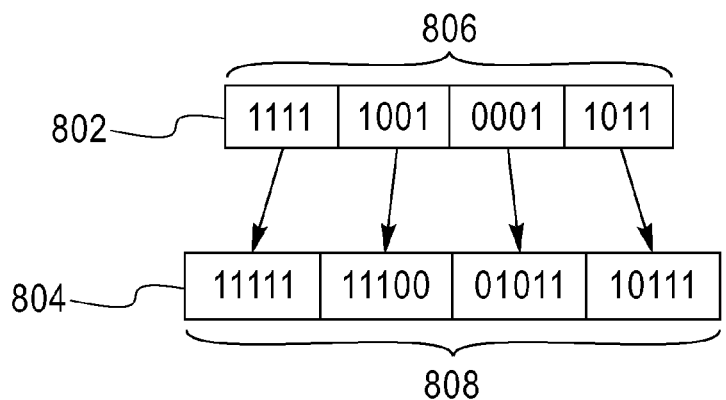
FIGS. 8a-8b illustrate error detection during decoding in accordance with an embodiment.
Figure 8B:
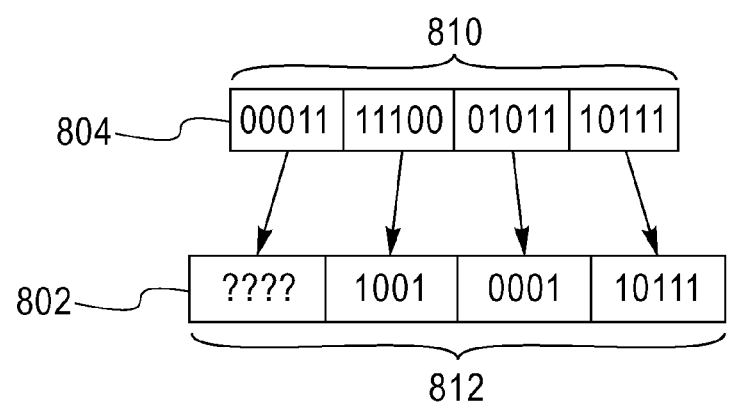

FIGS. 8a and 8b depict an embodiment of an error detection process based on the codeword lookup table 500 of FIG. 5. Turning to FIG. 8a, a set of q-bit symbols 806 (e.g., contained in sub-blocks) are first encoded using the codeword table 500. The first q-bit symbol 802 is a set of binary bits '11111.' The codeword column 506 of FIG. 5 indicates the corresponding B-bit symbol (also referred to herein as a "codeword") is '1111' and the MWE encoder module 208 of FIG. 2 will output a B-bit symbol, such as the first B-bit symbol 804, accordingly. The remaining q-bit symbols ('1001', '0001', and '1011') are similarly mapped to corresponding B-bit symbols ('11100', '01011', and '10111'). Turning to FIG. 8b the MWE decoder module 608 of FIG. 6 is used to decode the B-bit symbols 810 to q-bit symbols 812. The B-bit symbol 804 of FIG. 8b, has been retrieved from memory 102 with incorrect bit values. In particular, although the first B-bit symbol 804 was stored with the value '11111' it has been retrieved from memory 102 as '00011' due to errors in the memory 102, or other errors as will be understood by those in the art. When the MWE decoder module 608 attempts to retrieve the q-bit symbol from the codeword table 500 it finds no matching codeword. As a result, an erasure in the symbol is detected. Because the erasure is isolated to the first B-bit symbol 804, the remaining symbols can be decoded by the MWE decoder successfully. The erased symbol and the other decoded symbols will subsequently be input to the ECC decoder, which will correctly reconstruct the data.

Figure 9:
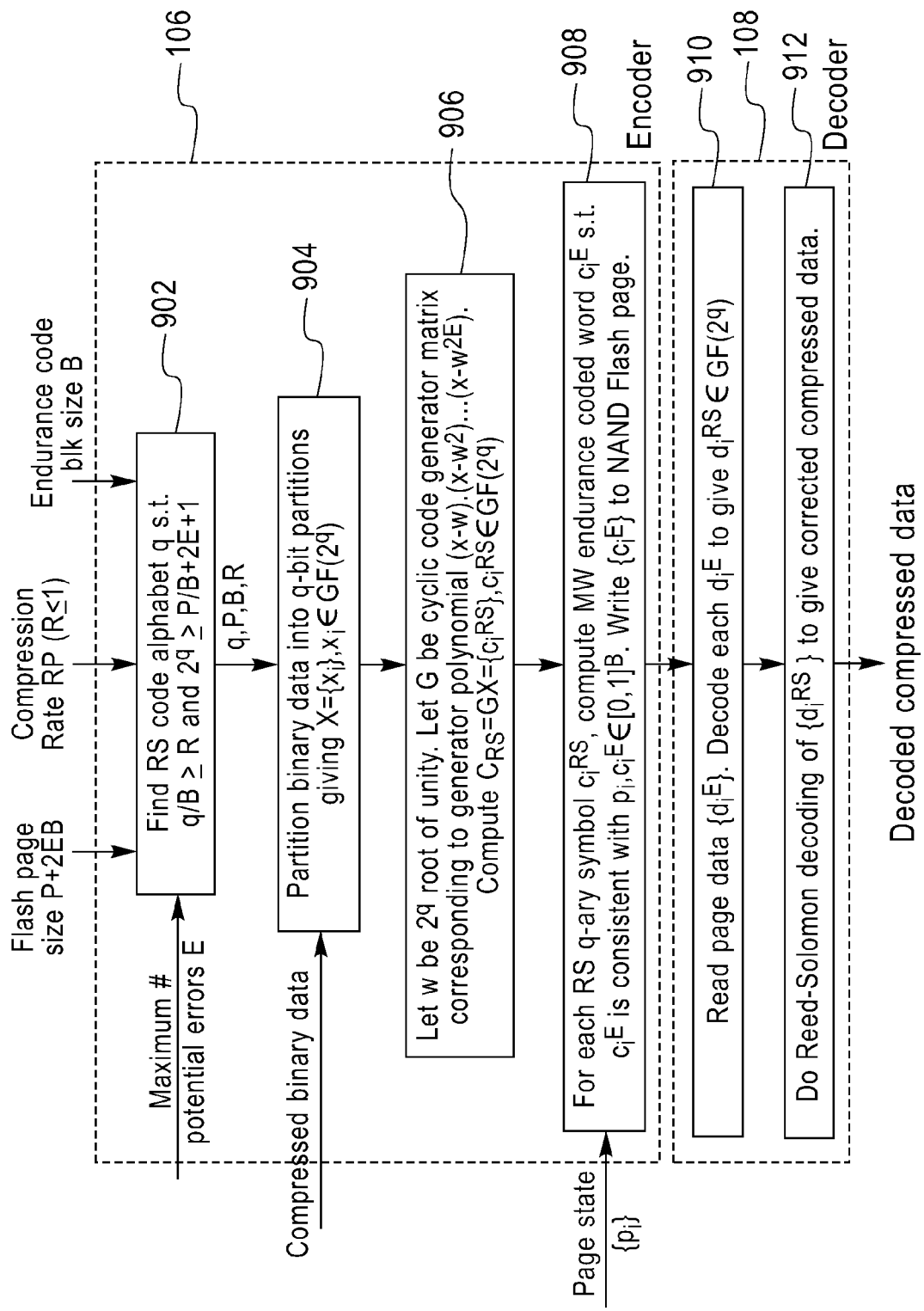
FIG. 9 illustrates a process flow for encoding and decoding data in accordance with an embodiment.

FIG. 9 illustrates a process flow for encoding and decoding data in accordance with an embodiment where the memory is a binary (e.g., SLC) flash memory and the ECC is a Reed-Solomon (RS) code. In an embodiment, the binary data is first compressed. At block 902, the flash page size P+2EB, the compression data rate RP (where R≤1), the number of potential errors E (which are all guaranteed to be corrected) and the endurance code block size B are all input to an RS code selection module. An RS code selection module selects a RS alphabet size q such that q/B is greater than or equal to the compression data rate R, and such that the RS block length $2^q-1$ is guaranteed to be greater than the number of required RS symbols P/B+2E. At block 904, the compressed binary data is partitioned into q-bit words $\{x_i\}$. As shown in block 906, the selected RS code is the cyclic code with generator polynomial given by the product $(x-w) \ldots (x-w^{2E})$, where w is a $2^q$th root of unity. The RS codeword is computed by multiplying the generator matrix of the code with the q-ary vector sequence X. Each symbol of the RS codeword is a q-bit symbol in $GF(2^q)$.

At block 908, the RS codeword is then input to a MWE coding module. The MWE coding module also has access to the page state information describing the current content of each memory cell $\{p_i\}$. For each q-ary symbol of the RS codeword, the MW endurance coding module computes a B-ary symbol that is consistent with the state of the corresponding memory cells (e.g. for NAND Flash SLC cells, the B-ary symbol does not have any "1" bits in cells whose underlying content is "0") and which minimizes wear. The sequence of B-ary symbols constitutes the word to be written into memory, the write word.

At block 910, the decoder reads the contents of the memory (i.e., reads the read word) and partitions the read word into B-ary symbols. These B-ary symbols are decoded to give the q-ary symbols corresponding to the RS codeword. Some of these errors will yield invalid B-ary symbols; these can be tagged as erasures. Such erasure identification can decrease the complexity of decoding and the probability of mis-correction. At block 912, the sequence of q-ary symbols and erasures is then input to a RS decoder, which yields the compressed data.

Technical effects and benefits include efficient storage of data in non-volatile memory by using MWE coding in conjunction with ECCs to efficiently store the data while retaining the error detection and/or correction of data stored in the non-volatile memory. In addition, the use of codewords for MWE allows for an extra layer of error detection at the symbol level and prevents the propagation of errors to other parts of the encoded data. Embodiments described herein are flexible in that, they can work with a large set of compression rates, flash page lengths, BERs, etc. Embodiments may also be adjusted dynamically to adapt to changes in the condition of the memory. The additional redundancy due to combining ECC and MWE coding is relatively small since any cell error is restricted to causing a q-ary symbol error, as in a conventional RS code. Finally, embodiments and methods described herein can be extended straightforwardly to the case where the physical memory cells are non-binary (e.g., MLC memory devices).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer implemented method for storing data, the method comprising:
    receiving write data comprising a plurality of bits;
    receiving a write address of a memory page in a memory, the memory page associated with a plurality of memory cells having current electrical charge levels;
    partitioning, at a computer, the write data into a plurality of q-bit sub-blocks, each q-bit sub-block comprising q bits of the write data;
    generating, at the computer, error correction bits in response to the q-bit sub-blocks and to an error correction code (ECC);
    appending at least one additional q-bit sub-block containing the error correction bits to the partitioned write data;
    generating a write word, the generating a write word comprising:
        performing for each of the q-bit sub-blocks including the at least one additional q-bit sub-block containing the error correction bits: selecting a codeword such that the codeword encodes the q-bit sub-block and is consistent with the current electrical charge levels of the plurality of memory cells associated with the memory page; and
        concatenating the selected codewords to form the write word; and
    writing the write word to the memory page.

2. The method of claim 1, wherein at least one of the q-bit sub-blocks comprising q bits of the write data is modified or replaced by the generated error correction bits.

3. The method of claim 1, wherein the memory page is in an erased state prior to the writing.

4. The method of claim 1, wherein the memory page is in a previously written state prior to the writing.

5. The method of claim 1, wherein the write data is compressed prior to the partitioning.

6. The method of claim 1, wherein the memory is implemented by a flash memory device.

7. The method of claim 1, wherein the memory is implemented by a single level cell not-and (NAND) flash memory device.

8. The method of claim 1, wherein the memory is implemented by a multi-level cell NAND flash memory device.

9. A system comprising:
    a receiver for receiving write data and a write address of a memory page in a memory, the memory page associated with a plurality of memory cells having current electrical charge levels;
    an encoder communicatively coupled to the memory, the encoder for performing a method comprising:
        partitioning the write data into a plurality of q-bit sub-blocks, each q-bit sub-block comprising q bits of the write data;
        generating error correction bits in response to the q-bit sub-blocks and to an error correction code (ECC);
        appending at least one additional q-bit sub-block containing the error correction bits to the partitioned write data;
        generating a write word, the generating a write word comprising:
        performing for each of the q-bit sub-blocks including the at least one additional q-bit sub-block containing the error correction bits: selecting a codeword such that the codeword encodes the q-bit sub-block and is consistent with the current electrical charge levels of the plurality of memory cells associated with the memory page; and concatenating the selected codewords to form the write word; and writing the write word to the memory page.

10. The system of claim 9, wherein at least one of the q-bit sub-blocks comprising q bits of the write data is modified or replaced by the generated error correction bits.

11. The system of claim 9, wherein the memory page is in an erased state prior to the writing.

12. The system of claim 9, wherein the memory page is in a previously written state prior to the writing.

13. The system of claim 9, wherein the write data is compressed prior to the partitioning.

14. The system of claim 9, wherein the memory is a single level cell not-and (NAND) flash memory device.

15. The system of claim 9, wherein the memory is a multi-level cell NAND flash memory device.

16. A computer implemented method for retrieving data from memory, the method comprising:

receiving a read address of a memory page in a memory;

retrieving a read word from the memory page, the read word comprising a plurality of multi-write endurance (MWE) codewords including at least one MWE codeword that corresponds to error correction bits;

determining, at a computer, that each of the MWE codewords is in a set of MWE codewords used to generate the read word;

generating read data, at the computer, the generating read data comprising:

performing for each of the MWE codewords: selecting a sub-block comprising data that corresponds to the MWE codeword;

concatenating the sub-blocks to generate the ECC codeword;

performing error correction code (ECC) processing on the ECC codeword; and removing the error correction bits from the ECC codeword resulting in the read data; and outputting the read data.

17. The method of claim 16, further comprising:

determining that a MWE codeword is not in the set of MWE codewords used to encode the read data; and marking the MWE codeword that is not in the set of MWE codewords used to encode the read data as an error, wherein an erased sub-block is substituted for the marked MWE codeword and the ECC processing is further responsive to the erased sub-block.

18. The method of claim 16, wherein the ECC processing corrects at least one error in the read data in response to determining that the read data contains at least one error.

19. The method of claim 16, wherein the memory is a single level cell not-and (NAND) flash memory device.

20. The system of claim 16, wherein the memory is a multi-level cell NAND flash memory device.

21. A system for retrieving data comprising:

a receiver for receiving a read address of a memory page in a memory;

a decoder communicatively coupled to the memory, the decoder for performing a method comprising:

retrieving a read word from the memory page, the read word comprising a plurality of multi-write endurance (MWE) codewords including at least one MWE codeword that corresponds to error correction bits;

determining, at a computer, that each of the MWE codewords is in a set of MWE codewords used to generate the read word;

generating read data, at the computer, the generating read data comprising:

performing for each of the MWE codewords: selecting a sub-block comprising data that corresponds to the MWE codeword;

concatenating the sub-blocks;

performing error correction code (ECC) processing on the read data in response to the error correction bits and to the sub-blocks; and removing the error correction bits from the read data; and outputting the read data.

22. The system of claim 21, wherein the method further comprises:

determining that a MWE codeword is not in the set of MWE codewords used to encode the read data; and marking the MWE codeword that is not in the set of MWE codewords used to encode the read data as an error, wherein an erased sub-block is substituted for the marked MWE codeword and the ECC processing is further responsive to the erased sub-block.

23. The system of claim 21, wherein the ECC processing corrects at least one error in the read data in response to determining that the read data contains at least one error.

24. The method of claim 21, wherein the memory is a single level cell not-and (NAND) flash memory device.

25. The system of claim 21, wherein the memory is a multi-level cell NAND flash memory device.

\* \* \* \* \*